US012589988B2

(12) United States Patent
Weber et al.

(10) Patent No.: US 12,589,988 B2
(45) Date of Patent: Mar. 31, 2026

(54) PRODUCTION METHOD FOR A MICROMECHANICAL COMPONENT FOR A SENSOR DEVICE OR MICROPHONE DEVICE

(71) Applicant: Robert Bosch GmbH, Stuttgart (DE)

(72) Inventors: Heribert Weber, Nuertingen (DE); Andreas Scheurle, Leonberg (DE); Hans Artmann, Boeblingen-Dagersheim (DE); Peter Schmollngruber, Aidlingen (DE); Thomas Friedrich, Moessingen-Oeschingen (DE); Uwe Schiller, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 440 days.

(21) Appl. No.: 18/246,790

(22) PCT Filed: Sep. 30, 2021

(86) PCT No.: PCT/EP2021/076983
§ 371 (c)(1),
(2) Date: Mar. 27, 2023

(87) PCT Pub. No.: WO2022/078771
PCT Pub. Date: Apr. 21, 2022

(65) Prior Publication Data
US 2023/0357001 A1 Nov. 9, 2023

(30) Foreign Application Priority Data
Oct. 15, 2020 (DE) ..................... 10 2020 213 030.2

(51) Int. Cl.
*B81C 1/00* (2006.01)
*B81B 3/00* (2006.01)

(52) U.S. Cl.
CPC ........ *B81C 1/00158* (2013.01); *B81B 3/0021* (2013.01); *B81B 2201/0257* (2013.01);
(Continued)

(58) Field of Classification Search
CPC ........ B81C 1/00158; B81C 2201/0105; B81C 2201/014; B81C 2203/038; B81B 3/0021;
(Continued)

(56) References Cited

U.S. PATENT DOCUMENTS 9,738,516 B2 * 8/2017 Chou .................. B81C 1/00595
2002/0093038 A1 7/2002 Ikeda et al.
(Continued)

FOREIGN PATENT DOCUMENTS

CN 104743505 A 7/2015
CN 105940287 A 9/2016
(Continued)

OTHER PUBLICATIONS

International Search Report for PCT/EP2021/076983, Issued Jan. 14, 2022.

*Primary Examiner* — Moazzam Hossain
(74) *Attorney, Agent, or Firm* — NORTON ROSE FULBRIGHT US LLP

(57) ABSTRACT

A production method for a micromechanical component for a sensor device or microphone device. The method includes: forming a supporting structure composed of a first sacrificial material on a substrate surface of a substrate with a first sacrificial material layer, a plurality of etching holes structured through the first sacrificial material layer, and a plurality of supporting posts projecting into the substrate; etching into the substrate surface at least one cavity spanned by the supporting structure; forming a diaphragm composed of at least one semiconductor material on or over the first sacrificial material layer of the supporting structure; depos-
(Continued)

iting a layer stack comprising at least one sacrificial layer and at least one counter electrode; and exposing the diaphragm by at least partially removing at least the supporting structure and the at least one sacrificial layer.

7 Claims, 12 Drawing Sheets

(52) U.S. Cl.
CPC ................. *B81B 2203/0307* (2013.01); *B81B 2203/0315* (2013.01); *B81B 2203/033* (2013.01); *B81B 2203/0353* (2013.01); *B81C 2201/0105* (2013.01); *B81C 2201/014* (2013.01); *B81C 2203/038* (2013.01)

(58) Field of Classification Search
CPC .... B81B 2201/0257; B81B 2203/0307; B81B 2203/0315; B81B 2203/033; B81B 2203/0353
See application file for complete search history.

(56) References Cited

U.S. PATENT DOCUMENTS

| | | | | |
|---|---|---|---|---|
| 2015/0008542 | A1* | 1/2015 | Kaelberer | G01L 9/0072 |
| | | | | 257/419 |
| 2018/0202807 | A1* | 7/2018 | Schelling | G01P 15/125 |
| 2019/0052976 | A1* | 2/2019 | Sun | H04R 7/04 |
| 2019/0241431 | A1* | 8/2019 | Sigl | B81C 1/00349 |
| 2021/0176569 | A1* | 6/2021 | Nawaz | G01L 23/125 |
| 2021/0392438 | A1* | 12/2021 | Stojanovic | H04R 7/14 |

FOREIGN PATENT DOCUMENTS

| | | |
|---|---|---|
| CN | 110697647 A | 1/2020 |
| DE | 102006024668 A1 | 11/2007 |
| DE | 102012217979 A1 | 4/2014 |
| DE | 102013213071 B3 | 10/2014 |
| JP | 2008131356 A | 6/2008 |

* cited by examiner

PRODUCTION METHOD FOR A MICROMECHANICAL COMPONENT FOR A SENSOR DEVICE OR MICROPHONE DEVICE

CROSS REFERENCE

The present invention relates to a production method for a micromechanical component for a sensor device or microphone device. The present invention also relates to a micromechanical component for a sensor device or microphone device.

BACKGROUND INFORMATION

In the related art, for example, German Patent Application No. DE 10 2012 217 979 A1, a diaphragm composed of at least one semiconductor material is used as the pressure-sensitive element of a sensor or of a microphone, with the diaphragm itself or an electrode attached to the diaphragm interacting with a fixed counter electrode. In this case, at least a subarea of a diaphragm surface of the diaphragm facing away from the counter electrode is generally exposed.

SUMMARY

The present invention provides a production method for a micromechanical component for a sensor device or microphone device, and a micromechanical component for a sensor device or microphone device.

The present invention provides micromechanical components each having a diaphragm which can be employed as a pressure-sensitive or soundwave-sensitive element, and which is better protected against mechanical damage or contaminations of the diaphragm compared with the related art. Since, in the micromechanical components made by way of the present invention, the diaphragm spans at least one free space etched into the substrate surface on its side facing away from the at least one interacting counter electrode, the substrate, with the substrate surface, contributes to reliable protection of the diaphragm from mechanical damage. At the same time, it may be ensured in a simple manner that, with a high probability, particles above a specifiable size cannot penetrate into the cavity that is etched into the substrate surface, and therefore the diaphragm deflection of the diaphragm of the micromechanical component and/or of the sensor device or microphone device formed therewith, which is needed for correct functioning thereof, is advantageously ensured. The present invention thus provides micromechanical components and/or a sensor device or microphone device formed therewith, the respective diaphragm of which can be employed more reliably for pressure measurement or for soundwave-electrical signal conversion. The micromechanical components made by way of the present invention likewise may have an increased service life compared with the related art.

In one advantageous specific embodiment of the production method of the present invention, to form the supporting structure composed of the first sacrificial material on the substrate surface of the substrate, the following steps are performed: structuring a plurality of trenches into the substrate surface of the substrate; depositing the first sacrificial material on the substrate surface with the plurality of trenches structured therein such that the plurality of supporting posts projecting into the substrate are formed from the first sacrificial material filled into the plurality of trenches and the substrate surface is at least partially covered with the subsequent first sacrificial material layer composed of the first sacrificial material; structuring the plurality of etching holes through the first sacrificial material layer; and etching the cavity into the substrate surface through the plurality of etching holes in the first sacrificial material layer. The method steps described here can be easily performed using standard processes from semiconductor technology. The supporting structure formed using the method steps described here is reliably suitable for producing at least one cavity that is etched into the substrate surface and spanned by the diaphragm, in particular a cavity spanned by the diaphragm and having an extension of the cavity oriented perpendicularly to the substrate surface greater than or equal to 5 μm.

According to an example embodiment of the present invention, before the diaphragm is formed, the first sacrificial material layer is preferably at least partially covered with a second sacrificial material layer composed of the first sacrificial material and/or a second sacrificial material, and when the diaphragm is being formed, the second sacrificial material layer is at least partially covered by the diaphragm. In this way, the etching holes structured into the first sacrificial material layer are able to be covered using the second sacrificial material layer, so that there is no risk of diaphragm material penetrating into the etching holes when the diaphragm is being formed.

In one advantageous specific embodiment of the present invention, the supporting structure is formed from silicon dioxide as the first sacrificial material. Thus, silicon dioxide, as a material that is already frequently used in semiconductor technology, may also be used to form the supporting structure and/or the second sacrificial material layer. This contributes to facilitating the method steps described above, and to implementing a sacrificial layer etching process which is to be performed subsequently.

As an advantageous development of the present invention, before the diaphragm is formed, silicon-rich silicon nitride, silicon nitride, silicon carbide, and/or aluminum oxide may be deposited locally on the first sacrificial material layer composed of silicon dioxide, on the second sacrificial material layer composed of silicon dioxide, and/or in at least one aperture structured through the first sacrificial material layer composed of silicon dioxide and/or the second sacrificial material layer composed of silicon dioxide. As explained in more detail below, in this way at least one lateral etch boundary and/or at least one electrical insulation composed of silicon-rich silicon nitride, silicon nitride, silicon carbide, and/or aluminum oxide may be formed which has a high etch resistance to some etchants that are frequently employed for etching silicon dioxide.

In a further advantageous specific embodiment of the production method of the present invention, to expose the diaphragm, at least one first etchant access extending through the layer stack, at least one second etchant access extending only through a part of the layer stack, and/or a channel extending through the substrate are formed, and at least the supporting structure and the at least one sacrificial layer are at least partially removed using at least one etchant passed through the at least one first etchant access, and/or through the at least one second etchant access, and/or through the at least one channel. As will be explained below, the method steps described here can be performed using standard processes from semiconductor technology. As an option, to feed pressure to the diaphragm, at least one channel may also be formed, extending through the substrate into the free space.

Preferably, a maximum gap width of the free space (between the diaphragm and the substrate) oriented perpendicularly to the substrate surface is greater than or equal to 5 μm. A gap width of this size offers sufficient volume for curvature of the diaphragm and prevents particles from sticking to the diaphragm.

According to an example embodiment of the present invention, a plurality of trenches are preferably etched into the substrate on a side of the free space facing away from the diaphragm and bordering the substrate. These trenches are remnants, traces, or impressions of trenches that have previously been etched into the substrate. These remnants, traces, or impressions in the substrate may be used, after a sacrificial layer etching process has been performed, to reliably recognize that the specific micromechanical component was produced by one of the production methods described above.

BRIEF DESCRIPTION OF THE DRAWINGS

Further features and advantages of the present invention will be explained below with reference to the figures.

FIGS. 1A through 1H show schematic illustrations of intermediate products and of a micromechanical component to explain a first specific embodiment of a production method for a micromechanical component for a sensor device or microphone device, according to an example embodiment of the present invention.

FIG. 2 shows a schematic illustration of a micromechanical component to explain a second specific embodiment of the production method of the present invention.

DETAILED DESCRIPTION OF EXAMPLE EMBODIMENTS

FIGS. 1A through 1H are schematic illustrations of intermediate products and of a micromechanical component to explain a first specific embodiment of a production method for a micromechanical component for a sensor device or microphone device.

Figures 1A, 1B:
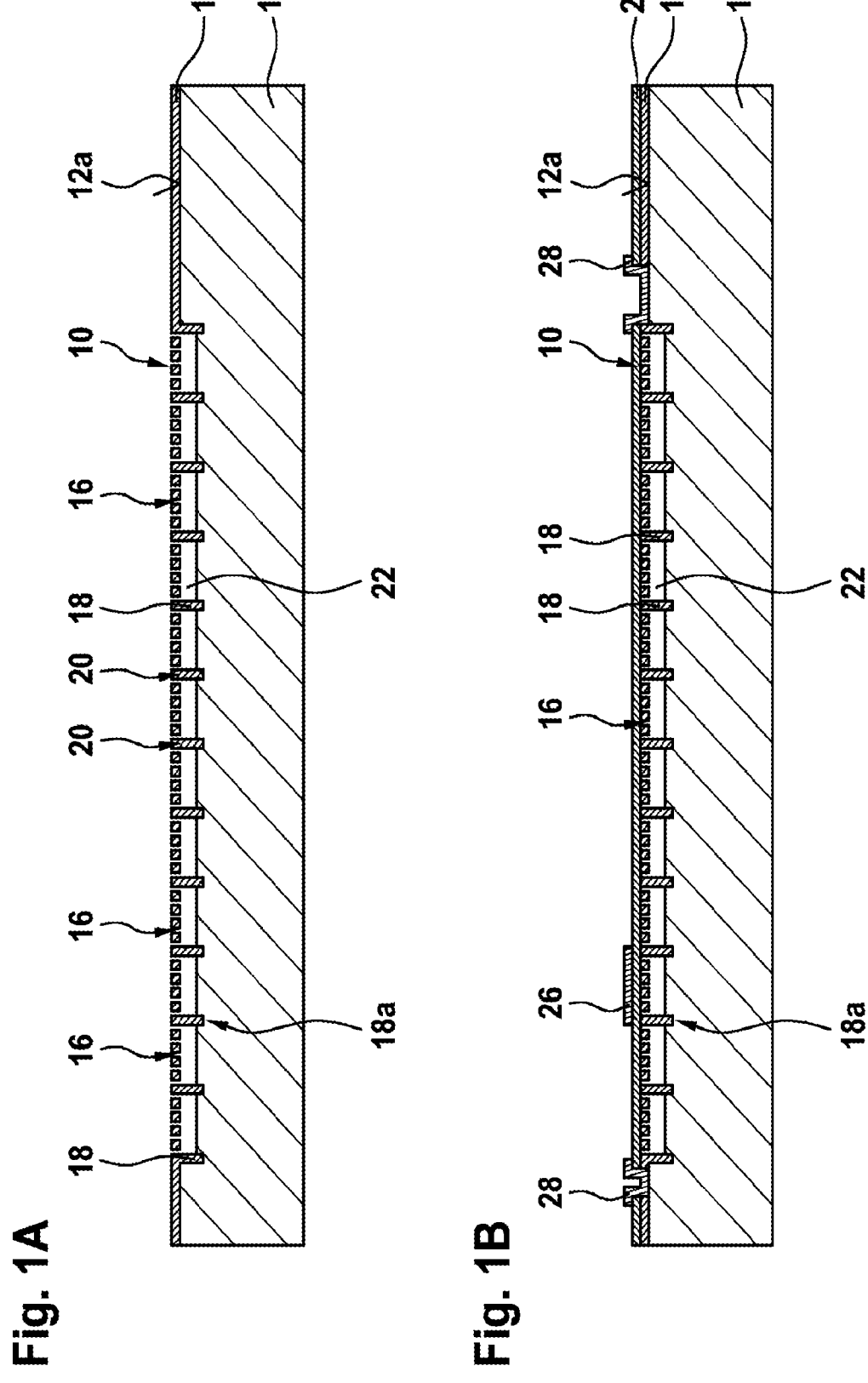

In a method step of the production method rendered schematically by FIG. 1A, a supporting structure 10 composed of a first sacrificial material is formed on a substrate surface 12a of a substrate 12. Supporting structure 10 is formed using a first sacrificial material layer 14 composed of the first sacrificial material at least partially covering substrate surface 12a, having a plurality of etching holes 16 structured through first sacrificial material layer 14, and using a plurality of supporting posts 18 composed of the first sacrificial material projecting into substrate 12. For example, supporting structure 10 is formed (completely) from silicon dioxide as the first sacrificial material. Substrate 12 is preferably a semiconductor substrate, such as in particular a silicon substrate. Instead of or as a supplement to silicon, however, substrate 12 may also comprise at least one other semiconductor material, at least one metal, and/or at least one electrically insulating material.

In the specific embodiment described here of the production method, to form supporting structure 10 composed of the first sacrificial material on substrate surface 12a of substrate 12, a plurality of trenches 20 are first structured into substrate surface 12a of substrate 12. The plurality of trenches 20 may be etched into substrate surface 12a with the aid of a plasma etching process/trench etching process, for example. Trenches 20 are structured into substrate surface 12a preferably with a trench depth oriented perpendicularly to substrate surface 12a of between 1 μm and 20 μm (micrometers), preferably with a trench depth of between 5 μm and 10 μm (micrometers). As will be explained in more detail below, the trench depth of trenches 20 determines a subsequent supporting post height of supporting posts 18. However, the numerical values given here for the trench depth of trenches 20 should be construed as exemplary only, as trenches 20 may be etched to any desired depth.

The first sacrificial material is then deposited on substrate surface 12a with the plurality of trenches 20 structured therein in such a way that the plurality of supporting posts 18 projecting into the substrate are formed from the first sacrificial material that has been filled (completely) into the plurality of trenches 20 and, in addition, substrate surface 12a is at least partially covered with the subsequent first sacrificial material layer 14 composed of the first sacrificial material. Supporting posts 18 may have a supporting post height oriented perpendicularly to substrate surface 12a of between 1 μm and 20 μm (micrometers). A supporting post height of supporting posts 18 of between 5 and 10 μm (micrometers) is preferred. The numerical values given here for the supporting post height of supporting posts 18 should not be construed as limiting, however. A maximum extension of at least one subsequently formed cavity 22 oriented perpendicularly to substrate surface 12a may be determined by way of the supporting post height of supporting posts 18. The plurality of etching holes 16 are then structured through first sacrificial material layer 14.

After supporting structure 10 has been formed, at least one cavity 22 spanned by supporting structure 10 is etched into substrate surface 12a. This takes place using an etchant passed through the plurality of etching holes 16 in first sacrificial material layer 14, to which etchant the first etch material has a higher etch resistance than substrate 12. An isotropic etching step, such as a silicon plasma etching process, for example, is preferably performed for etching the at least one cavity 22, during which process the plurality of etching holes 16 through first sacrificial material layer 14 are used as etch accesses. In this way, regions of substrate 12 between supporting posts 18 may be removed in a targeted manner. Supporting posts 18 may be partially exposed in this way, but preferably with the etching of the at least one cavity 22 only being performed as long as anchoring regions 18a of supporting posts 18 still project into substrate 12. The at least one cavity 22 is preferably etched with a maximum extension oriented perpendicularly to substrate surface 12a of less than the supporting post height of supporting posts 18.

Thus, even after the at least one cavity 22 has been etched, supporting structure 10 still exhibits advantageous stability. The anchoring regions 18a of supporting structures 18 in substrate 12 that remain after the at least one cavity 22 has been etched preferably have a height oriented perpendicularly to substrate surface 12a of between 0.5 mm and 2 μm (micrometers); these numerical values are to be construed as exemplary only. FIG. 1A shows the intermediate result after the at least one cavity 22 has been etched.

In the production method described here, first sacrificial material layer 14 is optionally at least partially covered (before the formation of a diaphragm to be described below) with a second sacrificial material layer 24 composed of the first sacrificial material and/or of a second sacrificial material. Etching holes 16 in first sacrificial material layer 14 can be sealed by second sacrificial material layer 24. Second sacrificial material layer 24 may optionally also be formed from silicon dioxide. As an advantageous development, in the production method being explained here, silicon-rich silicon nitride is also deposited (before the formation of the diaphragm to be described below) as at least one electrical insulation 26, and/or as at least one lateral etch boundary 28, on first/second sacrificial material layer 14 or 24 composed of silicon dioxide, and/or in at least one aperture structured through first sacrificial material layer 14 composed of silicon dioxide and/or second sacrificial material layer 24 composed of silicon dioxide. However, silicon nitride, silicon carbide, and/or aluminum oxide may also be used instead of silicon-rich silicon nitride to form the at least one electrical insulation 26, and/or the at least one lateral etch boundary 28. Since silicon-rich silicon nitride, silicon nitride, silicon carbide, and aluminum oxide have an advantageously low etch rate/high etch resistance in relation to many etchants that are frequently used for etching silicon dioxide, such as hydrofluoric acid in liquid or gaseous form, the at least one electrical insulation 26 and/or the at least one lateral etch boundary 28 can be formed without any problems even before at least parts of supporting structure 10 are removed. FIG. 1B shows the intermediate result after the optional method step for depositing silicon-rich silicon nitride.

Figure 1C:
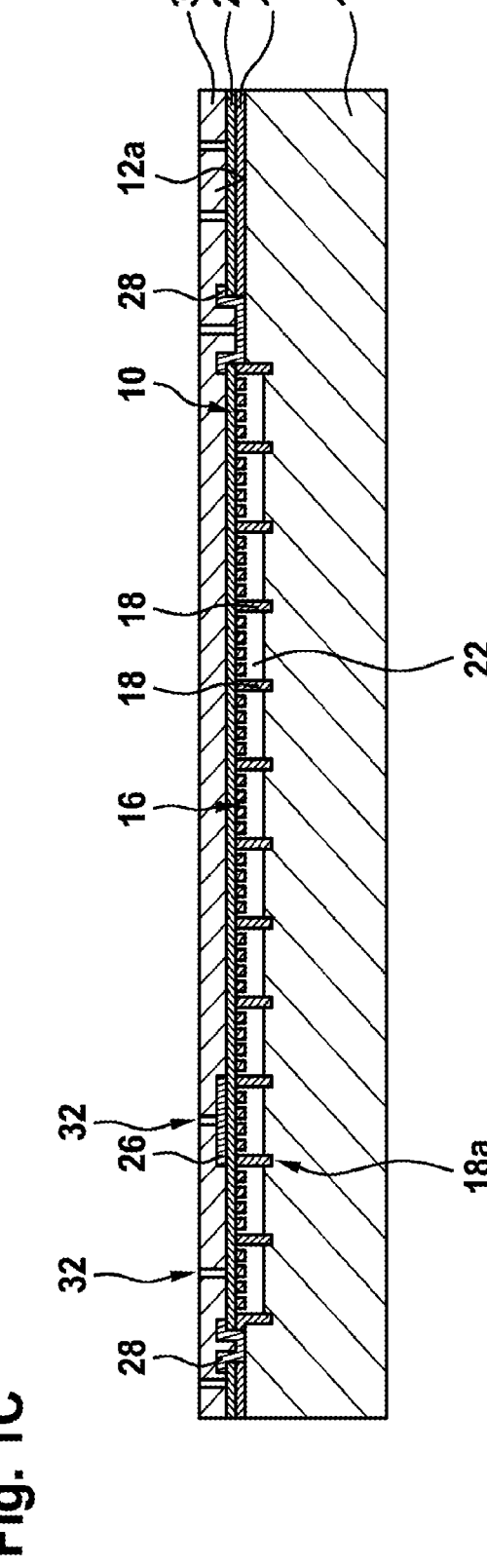

A diaphragm 30 composed of at least one semiconductor material, such as for example doped polysilicon, is then formed on/over first sacrificial material layer 14 of supporting structure 10. In the example of FIG. 1C, when diaphragm 30 is being formed, second sacrificial material layer 24 is at least partially covered by diaphragm 30. A deformability of individual diaphragm regions of diaphragm 30 may be influenced by the number and shape of supporting posts 18. Preferably, at least one through-opening 32 is then structured through diaphragm 30, through which at least one boundary surface of first/second sacrificial material layer 14 or 24, of the at least one electrical insulation 26, and/or of the at least one lateral etch boundary 28 may be exposed in a targeted manner.

Figure 1D:
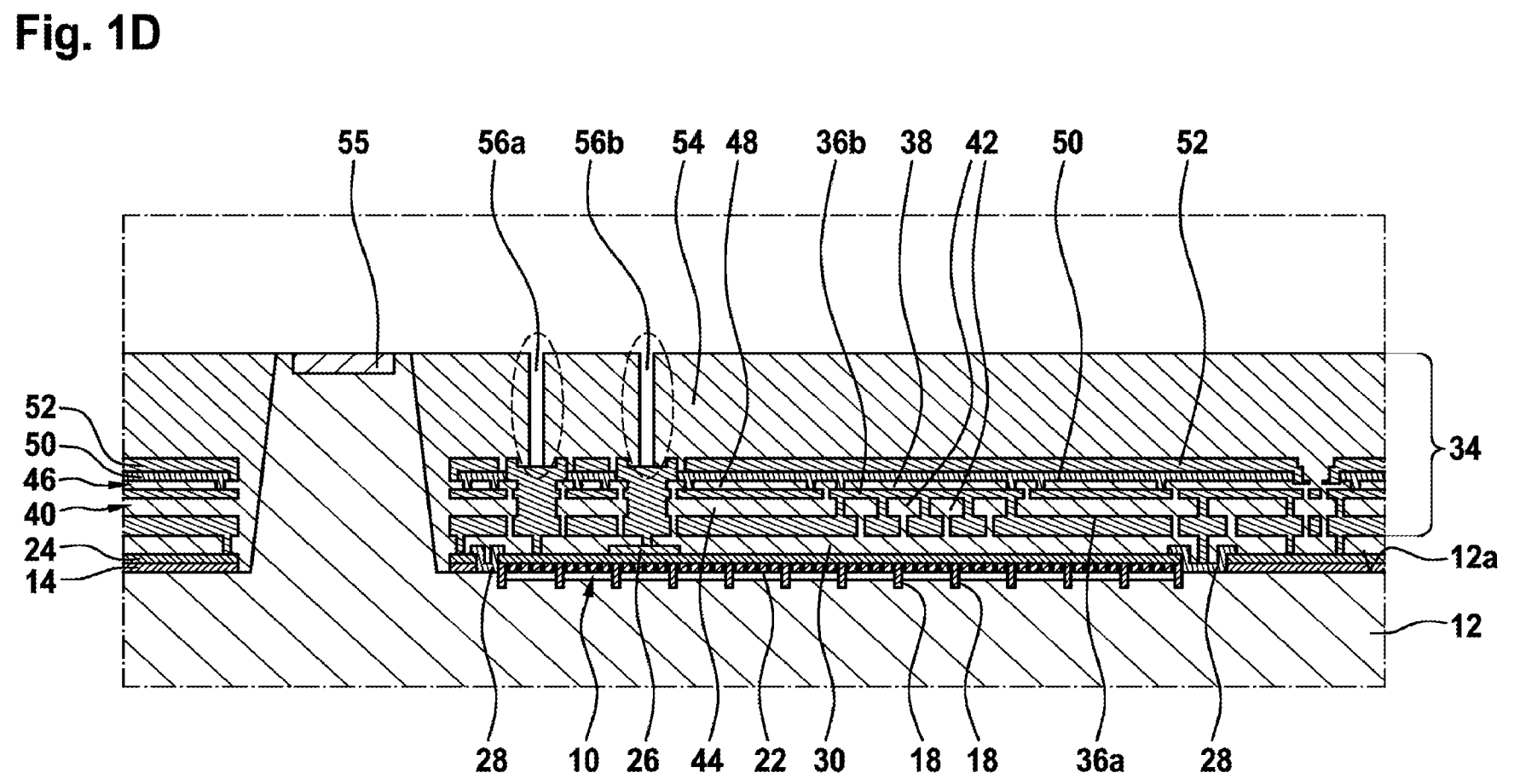

FIG. 1D shows an intermediate result after a layer stack 34 has been deposited on a side of diaphragm 30 oriented away from substrate 12, with layer stack 34 comprising at least one sacrificial layer 36a and 36b, and at least one counter electrode 38 formed on a side of the at least one sacrificial layer 36a and 36b facing away from diaphragm 30. In the specific embodiment described here, first of all a first sacrificial layer 36a, e.g., a silicon dioxide layer, is deposited on the side of diaphragm 30 facing away from substrate 12. A first electrode material layer 40 is subsequently deposited on at least subareas of first sacrificial material layer 36a, with at least one electrode 42 formed from first electrode material layer 40 possibly being mechanically affixed to, suspended on, or attached to diaphragm 30 and electrically connected to diaphragm 30 by way of part of the material of first electrode material layer 40 filled into at least one aperture structured through first sacrificial material layer 36a. At least one reference electrode 44 may optionally also be formed from first electrode material layer 40. First electrode material layer 40 may be, for example, a doped polysilicon layer.

In the production method described here, after first electrode material layer 40 has been deposited and structured, a second sacrificial layer 36b, in particular a silicon dioxide layer, is also deposited, at least a subarea of said layer being covered with a second electrode material layer 46 after it has been structured. The at least one counter electrode 38 is formed from the at least one second electrode material layer 46. As an option, at least one reference counter electrode 48 may additionally be structured from second electrode material layer 46, which reference counter electrode 48 may form a reference capacitor structure with at least one reference electrode 44 that consists of the material of electrode material layer 40. By way of part of the material of second electrode material layer 46 filled into at least one aperture running through second sacrificial material layer 36b, the at least one reference electrode 44 may be affixed to at least a subarea of second electrode material layer 46 in such a way that, even in the event of a subsequent curvature of diaphragm 30, (substantially) no change in distance occurs between the at least one reference electrode 44 and its associated reference counter electrode 48 in each case.

At least subareas of second electrode material layer 46 are then covered with at least one insulating layer 50 and (optionally) a further layer 52, e.g., a further insulating layer. To prevent subsequent undercutting of second electrode material layer 46 during a sacrificial layer etching process, at least subareas of second electrode material layer 46 are covered with a layer 50 composed of silicon-rich silicon nitride (as a first insulating layer 50). A further layer 52 composed of silicon dioxide (as a second insulating layer 52) is then (optionally) deposited on layer 50 composed of silicon-rich silicon nitride. To impart mechanical strength to layer stack 34, a supporting layer/reinforcing layer 54 composed of polysilicon (possibly grown in an epitaxial reactor and/or LPCVD tube, at least in part) is preferably also applied on/over layers 50 and 52. At least one doping region 55 may optionally also be introduced into supporting layer/reinforcing layer 54. However, it is pointed out that the configuration of layer stack 34 reproduced in FIG. 1D should be construed as exemplary only.

In the production method described here, at least one etchant access 56a and 56b extending through layer stack 34 is also formed for subsequently exposing diaphragm 30 in order to remove, at least partially, at least supporting structure 10 and the at least one sacrificial layer 36a and 36b using at least one etchant passed through the at least one etchant access 56a and 56b. The at least one etchant access 56a and 56b may also be understood in each case to be an etching channel. FIG. 1D shows the intermediate product after the formation of the at least one etchant access 56a and 56b but before the etching of at least the supporting structure 10 and of the at least one sacrificial layer 36a and 36b.

By way of example, in the production method described here, not only at least one first etchant access 56a extending through layer stack 34 but also at least one second etchant access 56b extending through only a part of layer stack 34 are formed for exposing diaphragm 30. A subsequent etching of the at least one sacrificial layer 36a and 36b may take place as a result of the additional formation of the at least one second etchant access 56b.

Figure 1E:
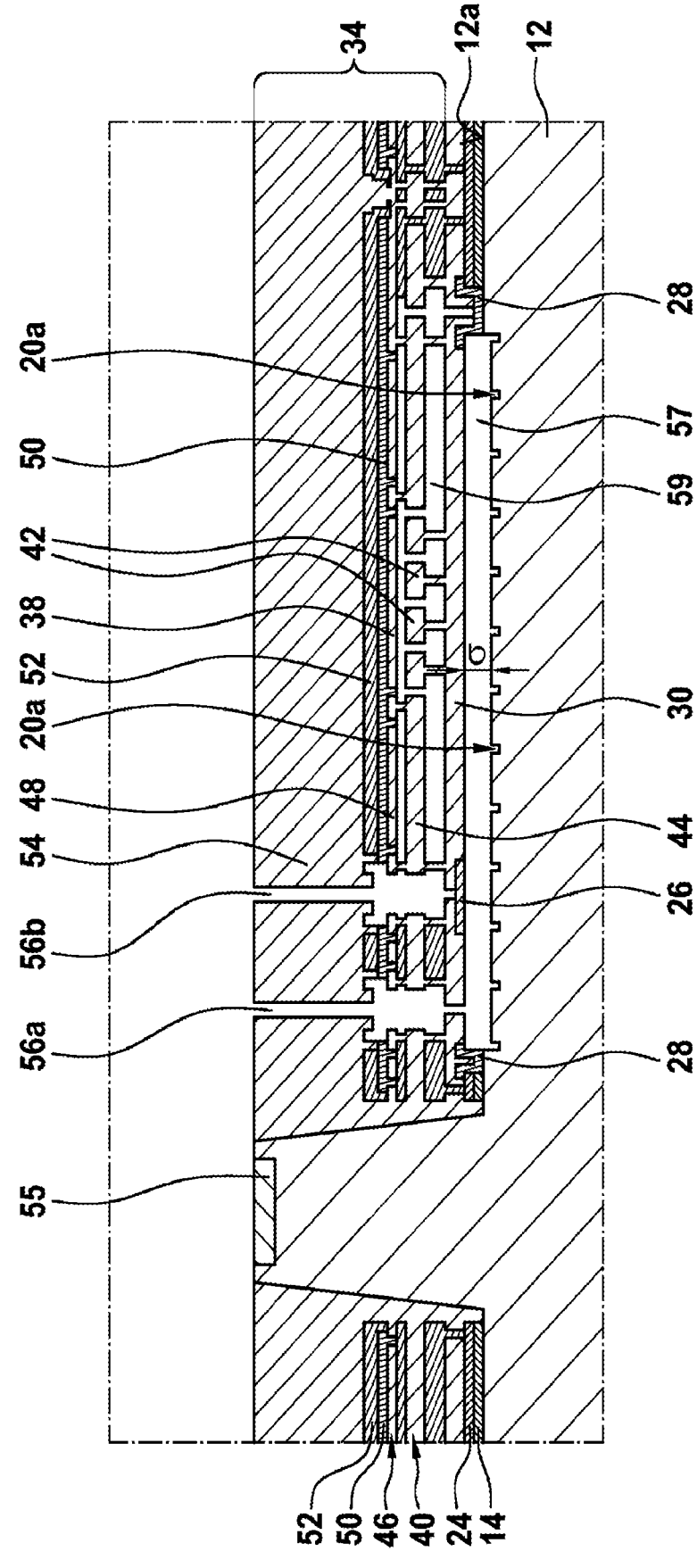

In FIG. 1E, the intermediate product after diaphragm 30 has been exposed is shown. At least supporting structure 10, possibly second sacrificial material layer 24, and the at least one sacrificial layer 36a and 36b are at least partially removed using at least one etchant passed through the at least one first etchant access 56a and/or through the at least one second etchant access 56b. A hydrofluoric acid-containing gas phase etching process, for example, may be employed to perform the etching. It is explicitly pointed out that it is possible to expose diaphragm 30 by at least partially removing at least supporting structure 10, possibly second sacrificial material layer 24, and the at least one sacrificial layer 36a and 36b by way of rapid etching, since the regions to be etched are able to be supplied reliably with the etchant, such as in particular hydrofluoric acid (HF) vapor, by way of the at least one etchant access 56a and 56b. The material-free region inside the at least one cavity 22 that has been formed facilitates the spread of the etchant in cavity 22 and the etching of supporting structure 10 despite its position between diaphragm 30 and substrate 12. On the other hand, if the volume of the at least one cavity 22 were completely filled with the at least one first sacrificial material and/or with the at least one second sacrificial material, the production/etching of the volume or of the at least one cavity 22 between diaphragm 30 and substrate 12 would be significantly more time-consuming.

As can be seen in FIG. 1E, the removal of at least parts of supporting structure 10 and possibly of second sacrificial material layer 24 creates a free space 57 between diaphragm 30 and substrate 12. Free space 57 may, for example, have a maximum gap width σ oriented perpendicularly to substrate surface 12a of between 1 μm and 15 μm (micrometers). An advantageous curvature capacity of diaphragm 30 is thus ensured. At the same time, the formation of free space 57 between diaphragm 30 and substrate 12 ensures reliable protection of diaphragm 30 against mechanical damage or contaminants. In particular, substrate 12 contributes to reliable protection of the diaphragm from mechanical damage. Advantageous ways of preventing contaminants from penetrating into free space 57 between diaphragm 30 and substrate 12 will be described below.

The maximum gap width σ of free space 57 oriented perpendicularly to substrate surface 12a is preferably greater than or equal to 5 μm (micrometers). It can also be seen in FIG. 1E that a plurality of trenches 20a etched into substrate 12 remain as residual structures 20a on a side of free space 57 facing away from diaphragm 30 and bordering substrate 12. The trenches 20a, which may be referred to as residual structures 20a, are "traces" or impressions of anchoring regions 18a of former supporting posts 18 still projecting into substrate 12 after supporting posts 18 have been etched in the at least one cavity 22. As shown in FIG. 1E, the removal of at least parts of supporting structure 10 and possibly of second sacrificial material layer 24 to produce a free space 57 between diaphragm 30 and substrate 12 simultaneously causes the removal of at least parts of the at least one sacrificial layer 36a and 36b and the production of a void 59 in layer stack 34.

Figure 1F:
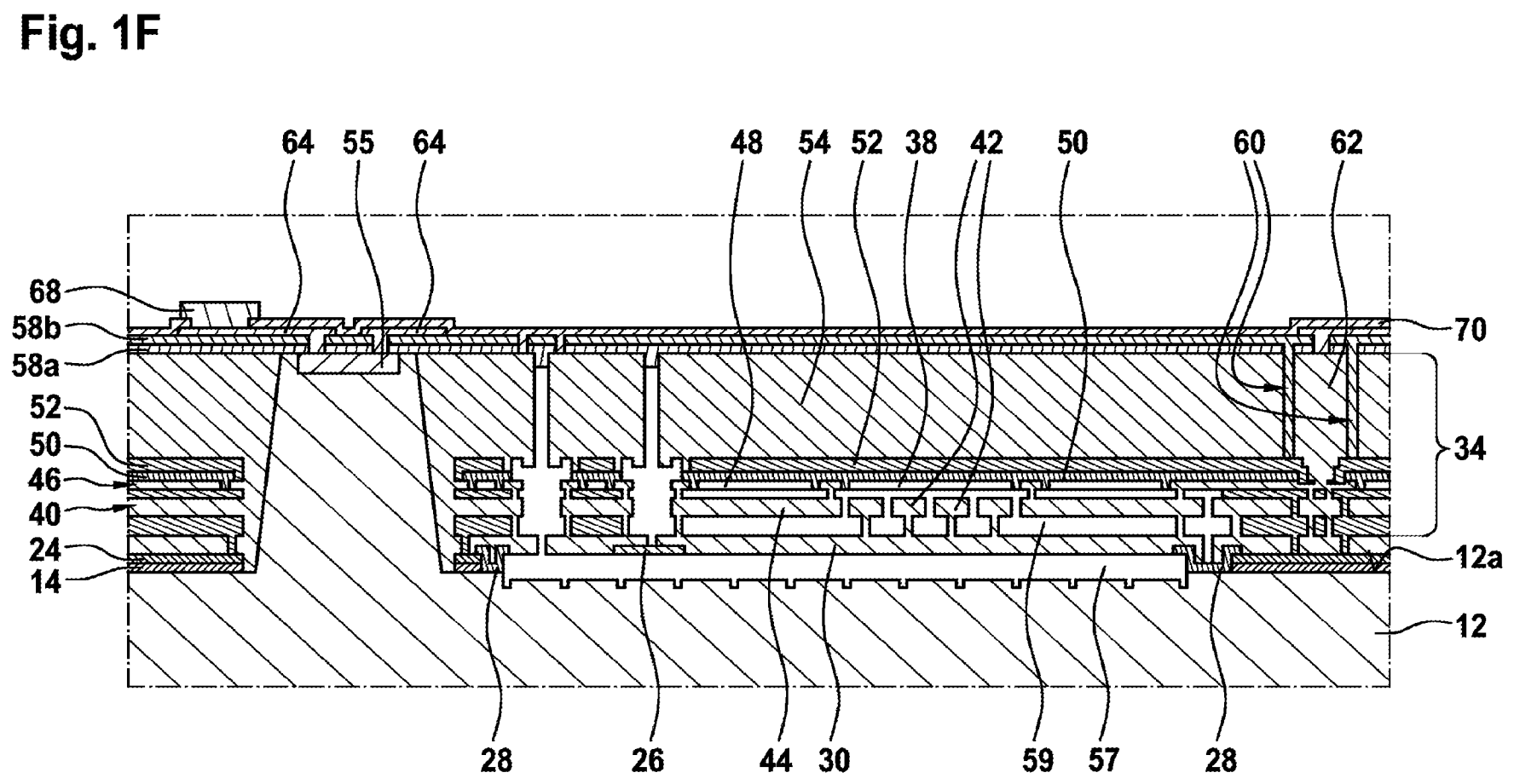

As depicted in FIG. 1F, the at least one etchant access 56a and 56b can then be sealed using at least one layer 58a and 58b, e.g., at least one further insulating layer 58a and 58b, applied on a side of layer stack 34 facing away from substrate 12. Instead of the at least one layer 58a and 58b, however, a eutectic seal, such as a gold-silicon eutectic, may also be used to seal the at least one etchant access 56a and 56b. Likewise, a laser reseal process may be performed to seal the at least one etchant access 56a and 56b, using silicon that has been melted/liquefied by a laser as a sealing material.

A silicon dioxide layer 58a, an aluminum oxide layer (not shown), and/or a silicon nitride layer 58b, especially a silicon-rich silicon nitride layer 58b, for example, may be deposited on layer stack 34 as the at least one further insulating layer 58a and 58b. At least one isolation trench 60 structured through layer stack 34 may also be at least partially filled with the material of the at least one further insulating layer 58a and 58b to insulate at least one via 62 through layer stack 34.

As an option, at least one conductive track 64, composed of, for example, aluminum, which may optionally include components composed of silicon and/or copper, and/or composed of doped silicon, may also be formed on the at least one further insulating layer 58a and 58b. By way of at least one aperture structured through the at least one further insulating layer 58a and 58b, the at least one conductive track 64 may be electrically connected to the at least one via 62 and/or to the at least one doping region 55 in the supporting layer 54. For the electrical bonding of the at least one conductive track 64, at least one bond pad 68 may be arranged on the at least one conductive track 64, which bond pad 68 may consist of the layers, layer sequences or layer compositions conventional in semiconductor technology, and/or of germanium, of a layer sequence of aluminum and germanium (optionally with components composed of silicon and copper), and/or of a layer sequence composed of gold and germanium (optionally with components composed of silicon and/or copper). As an option, a covering layer 70, such as, for example, a covering layer 70 composed of silicon oxide, aluminum oxide, silicon carbide, silicon nitride, and/or silicon-rich silicon nitride, may also be deposited and structured on the at least one further insulating layer 58a and 58b, the at least one conductive track 64, and/or the at least one bond pad 68. The intermediate result is shown in FIG. 1F.

Figure 1G:
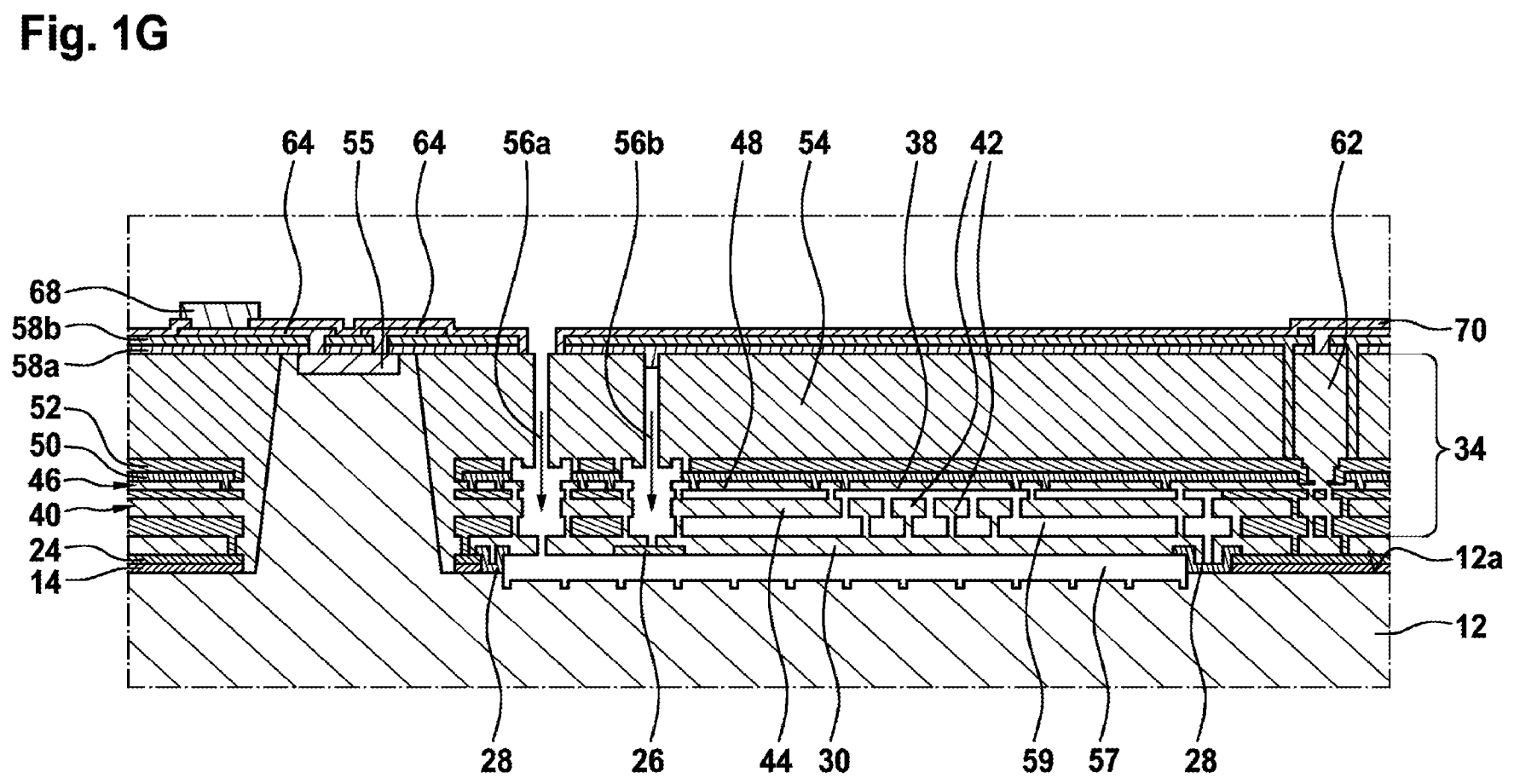

FIG. 1G shows the intermediate product, after the at least one first etchant access 56a has been exposed, from a side of the intermediate product facing away from substrate 12. Thus, the at least one first etchant access 56a may also be utilized as (at least part of a) pressure supply line, soundwave supply line, or medium feed to free space 57 between diaphragm 30 and substrate 12 during a subsequent utilization of the micromechanical component. On the other hand, the at least one second etchant access 56b remains sealed and is thus protected against penetration by foreign bodies or liquids.

Figure 1H:
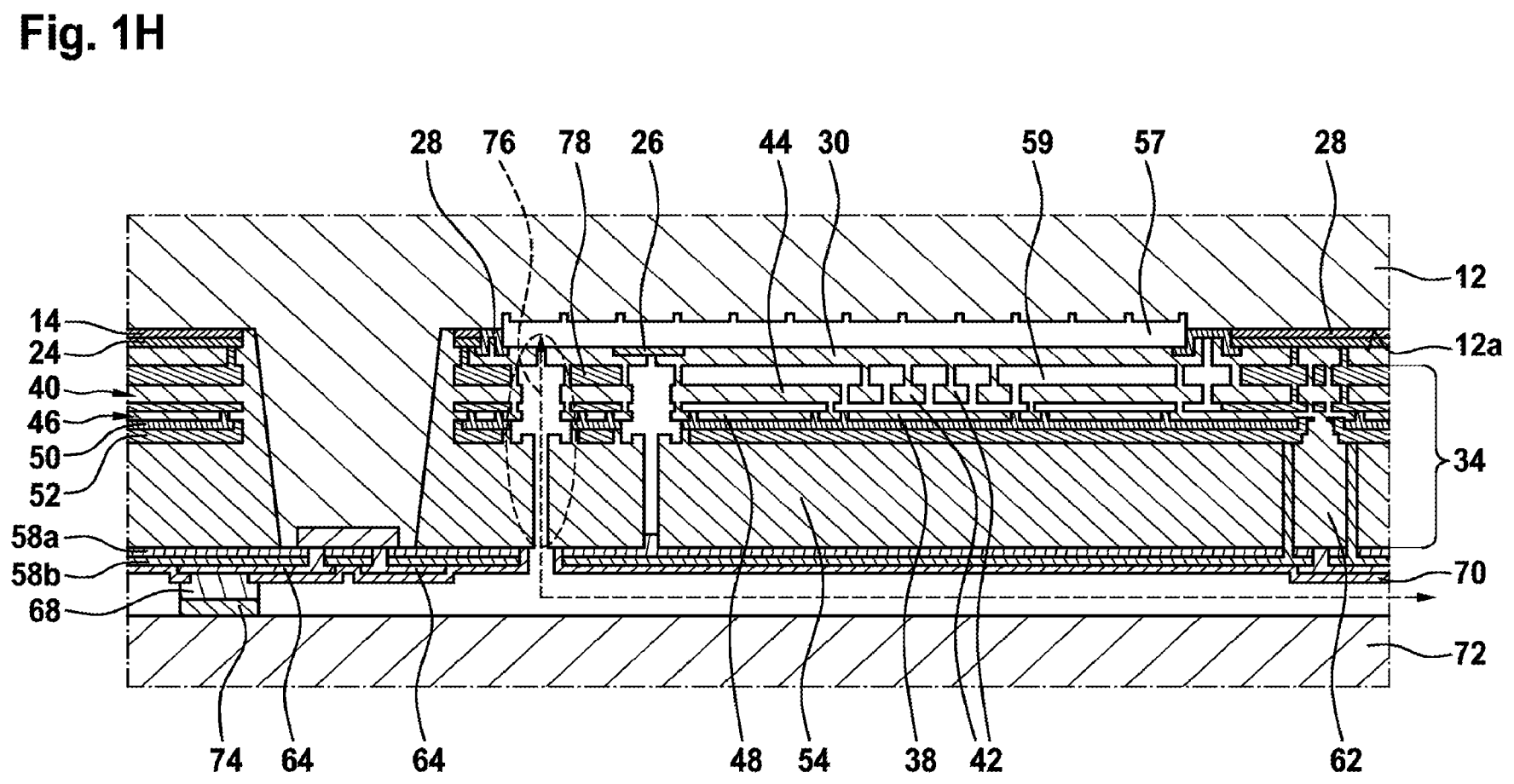

FIG. 1H shows the finished micromechanical component after a final optional method step, in which the side of the intermediate product facing away from substrate 12 is fastened to an application-specific integrated circuit (ASIC) 72 or to a circuit board. The intermediate product may be fastened to ASIC 72 or to the circuit board by way of a bonding process/wafer bonding process using the at least one bond pad 68 fastened to the intermediate product, and/or at least one separately arranged bonding/connecting surface, consisting of, e.g., the material of the at least one bond pad 68 and of at least one (corresponding) further bond pad 74 fastened to ASIC 72 or to the circuit board, and/or of the at least one separately arranged bonding/connecting surface. As can be seen in FIG. 1H, in the micromechanical component a pressure feed, soundwave feed, or medium feed 76 to free space 57 therefore also runs between ASIC 72 or the circuit board, and layer stack 34. However, the spacing between ASIC 72 or the circuit board and layer stack 34, which is established during bonding, not only serves for pressure feed, soundwave feed, or medium feed 76 but also contributes to the additional prevention of foreign bodies being introduced into the free space between ASIC 72 or the circuit board, and layer stack 34 and/or free space 57. Although not depicted, it is also possible to fasten the intermediate product to ASIC 72 or the circuit board with the aid of the flip-chip technique using solder balls on bond pads, and/or of the separately arranged bonding/connecting surfaces.

Figure 2:
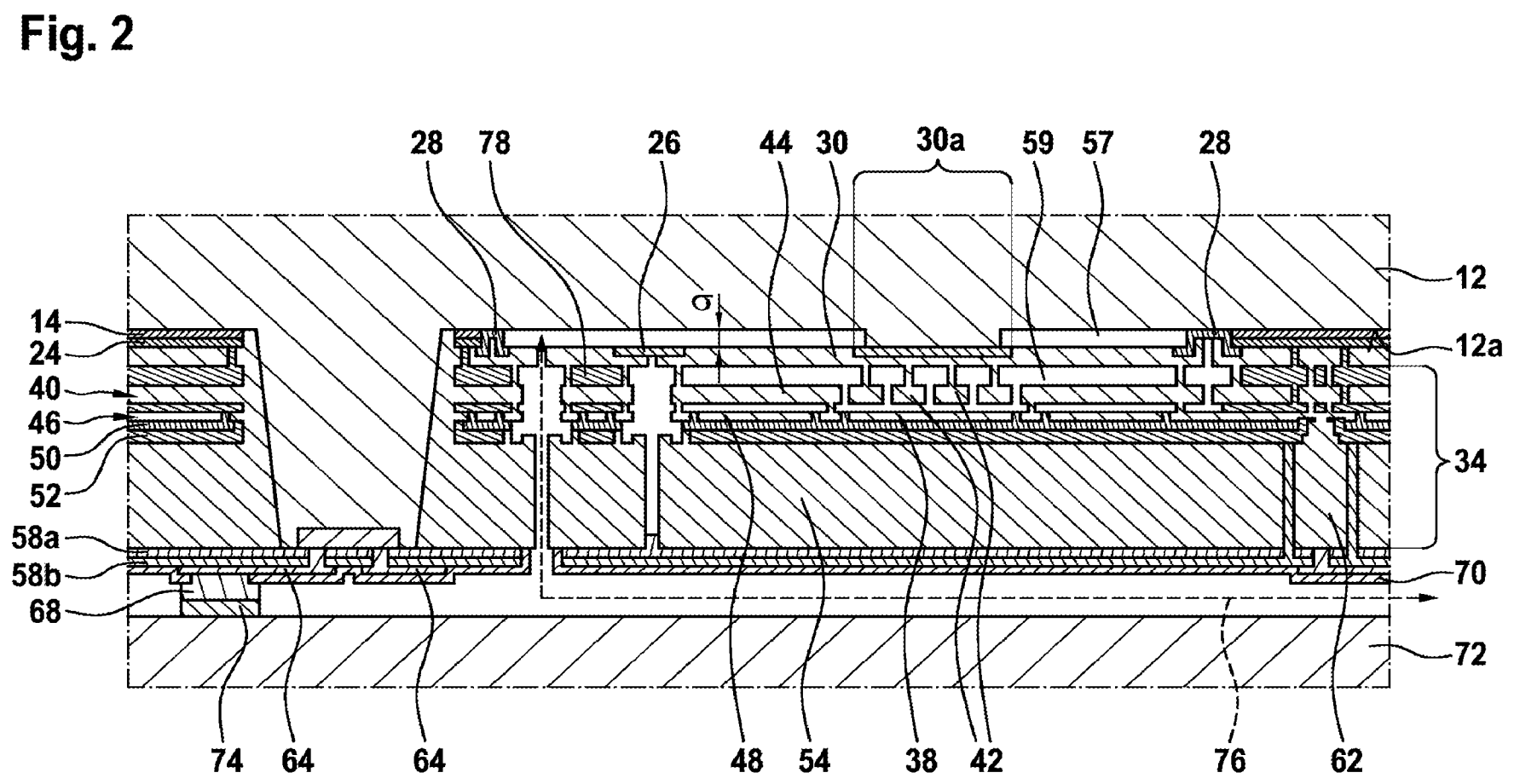

FIG. 2 is a schematic illustration of a micromechanical component to explain a second specific embodiment of the production method.

In the production method reproduced schematically by FIG. 2, supporting structure 10 is configured such that a subsequent central diaphragm region 30a of diaphragm 30 is locally attached mechanically to substrate 12 but may (optionally) be electrically insulated from substrate 12 by way of an electrical insulation 26. By thinning substrate 12, substrate 12 may be implemented as a "further diaphragm", which may be connected to diaphragm 30 mechanically and (optionally) in an electrically insulated manner. If, for example, in this case there is a first pressure in free space 57 and a second pressure, which is not equal to the first pressure, on an outer side of substrate 12 facing away from free space 57, a pressure difference between the first pressure and the second pressure can be determined as a result of the mechanical coupling of diaphragm 30 and the "further diaphragm" of substrate 12.

With regard to further method steps of the production method of FIG. 2, reference is made to the specific embodiment of FIG. 1A through 1H described above.

Figure 3:
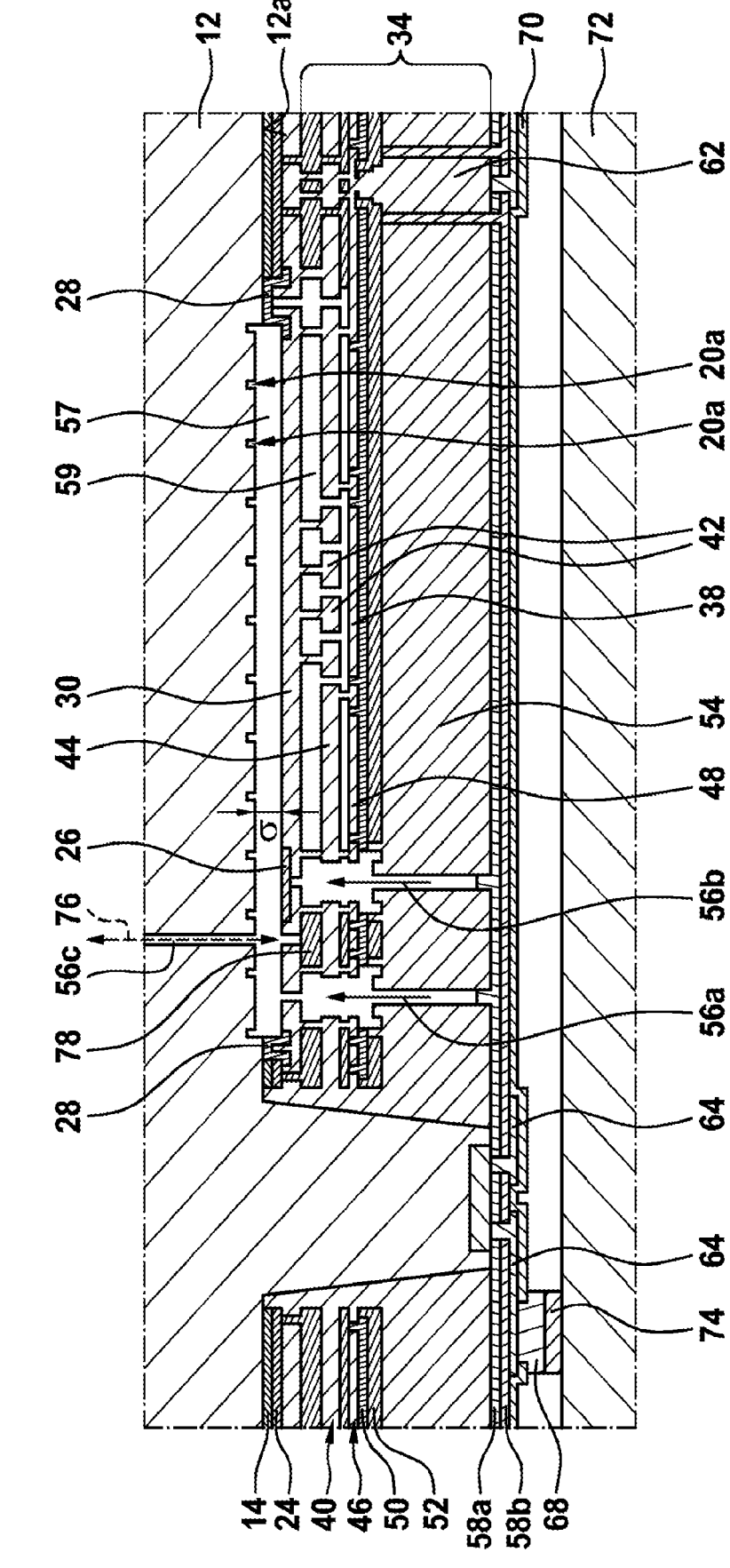
FIG. 3 shows a schematic illustration of a micromechanical component to explain a third specific embodiment of the production method of the present invention.

FIG. 3 is a schematic illustration of a micromechanical component to explain a third specific embodiment of the production method.

The production method reproduced schematically by way of FIG. 3 differs from the specific embodiment of FIG. 1A through 1H only in that pressure is fed to diaphragm 30 through at least one channel 56c, which extends through substrate 12 and allows pressure to be introduced into free space 57 between diaphragm 30 and substrate 12. This at least one channel 56c may be utilized as an alternative or in addition to the at least one first etching channel/etchant access 56a as a pressure feed, soundwave feed, or medium feed 76 to free space 57.

Alternatively, the at least one channel 56c may be configured as a third etchant access 56c for exposing diaphragm 30, with at least supporting structure 10 and possibly second sacrificial material layer 24 being at least partially removed using a first etchant passed through the at least one third etchant access 56c and possibly also through the at least one first etchant access 56a, and the at least one sacrificial layer 36a and 36b being at least partially removed using a first etchant and/or second etchant passed through the at least one second etchant access 56b.

In the production method described here, it is also possible to omit the formation of the at least one first etchant access 56a. It can also be seen in FIG. 3 that, in the structuring of the at least one channel 56c through substrate 12, at least one region 78 of the at least one sacrificial layer 36a and 36b may be used as a trench stop structure.

With regard to further method steps of the production method of FIG. 3, reference is made to the specific embodiment of FIG. 1A through 1H described above.

FIGS. 4A through 4F are schematic illustrations of intermediate products to explain further specific embodiments of the micromechanical component.

Figure 4A:
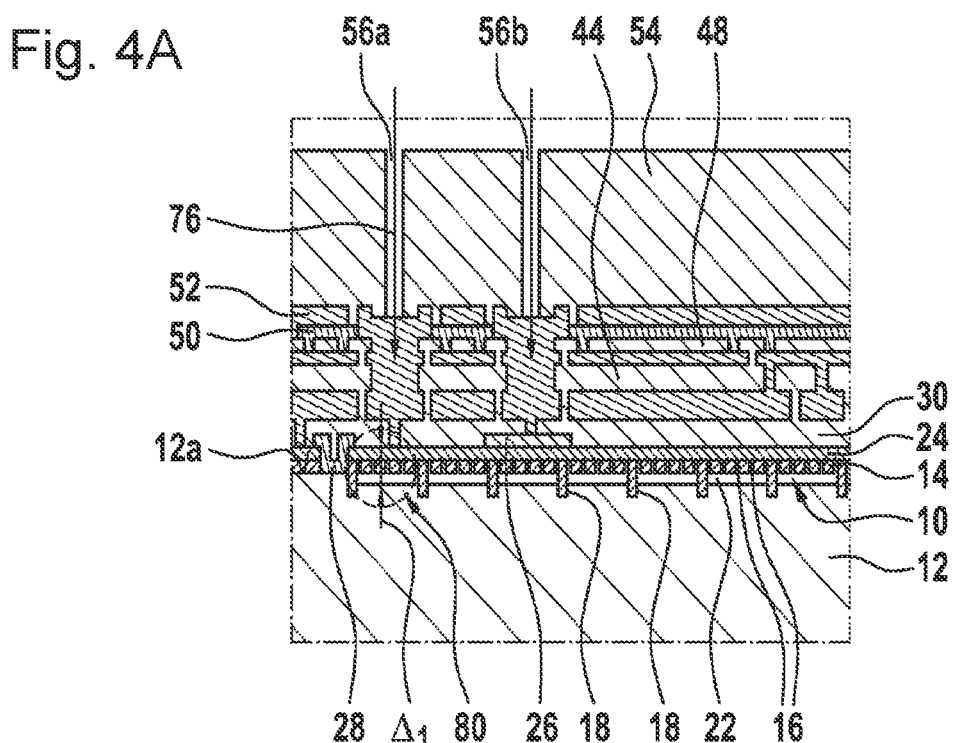
FIGS. 4A through 4F show schematic illustrations of intermediate products to explain further specific embodiments of the micromechanical component.

FIG. 4A is a partial section of FIG. 1D. It can be seen in FIG. 4A that, at a subsequent outlet 80 of pressure feed, soundwave feed, or medium feed 76 at free space 57, a gap distance $\Delta_1$ oriented perpendicularly to substrate surface 12a is equal to a sum of the maximum extension of the at least one cavity 22 oriented perpendicularly to substrate surface 12a, a first layer thickness of first sacrificial material layer 14, and a second layer thickness of second sacrificial material layer 24. The particles/foreign particles penetrating into free space 57 through gap distance $\Delta_1$ at the subsequent outlet 80 of pressure feed, soundwave feed, or medium feed 76 can thus have at most a size equal to the sum of the maximum extension of the at least one cavity 22, the first layer thickness of first sacrificial material layer 14, and the second layer thickness of second sacrificial material layer 24.

Figure 4B:
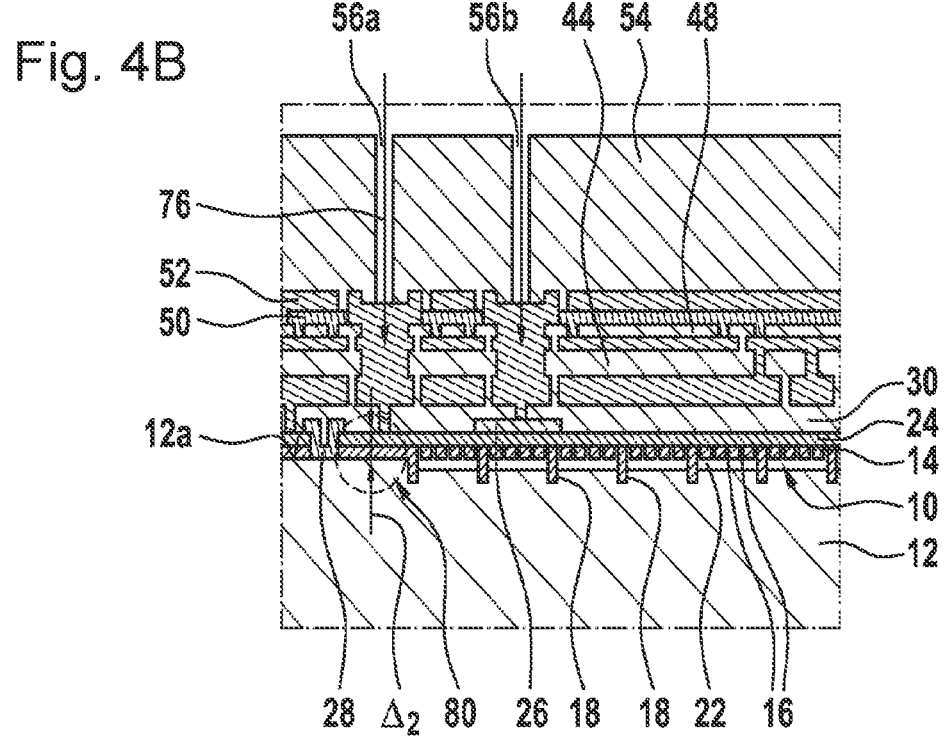

On the other hand, in the example of FIG. 4B the gap distance $\Delta_2$ oriented perpendicularly to substrate surface 12a at the subsequent outlet 80 of pressure feed, soundwave feed, or medium feed 76 at free space 57 is reduced to the sum of the first layer thickness of first sacrificial material layer 14 and the second layer thickness of second sacrificial material layer 24. This is achieved by locally omitting the formation of etching holes 16 through first sacrificial material layer 14 at the subsequent outlet 80 of pressure feed, soundwave feed, or medium feed 76 at free space 57. Particles penetrating into free space 57 through the gap distance $\Delta_2$ at the subsequent outlet 80 of pressure feed, soundwave feed, or medium feed 76 can therefore have at most a size equal to the sum of the first layer thickness of first sacrificial material layer 14 and the second layer thickness of second sacrificial material layer 24.

Figure 4C:
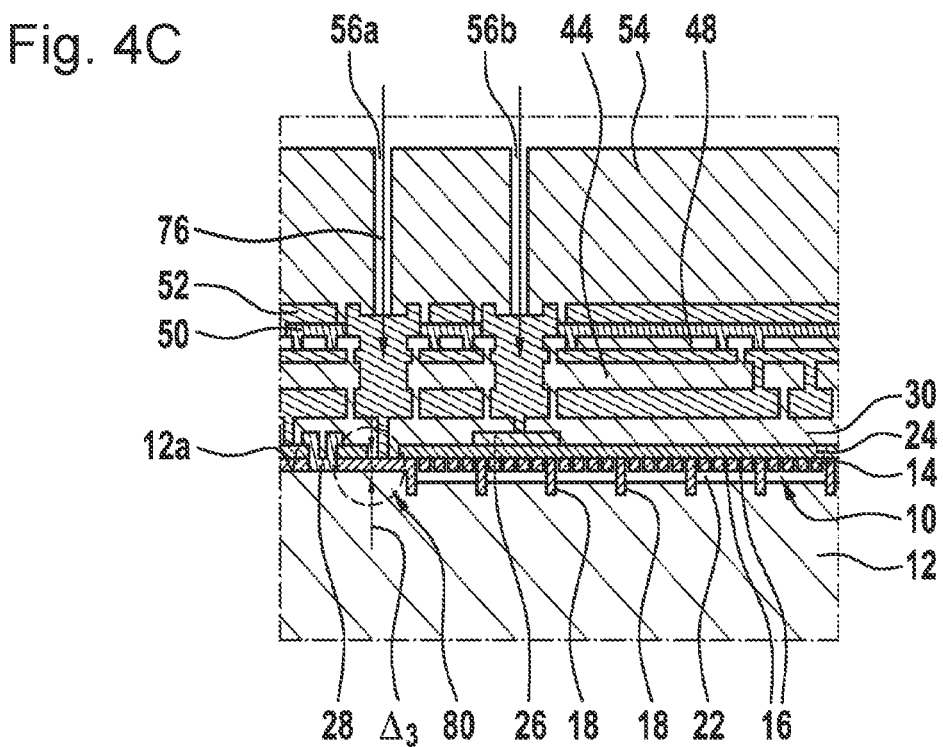

In the example of FIG. 4C, the gap distance $\Delta_3$ oriented perpendicularly to substrate surface 12a at the subsequent outlet 80 of pressure feed, soundwave feed, or medium feed 76 into free space 57 is reduced to the first layer thickness of first sacrificial material layer 14. This is achieved by locally omitting the formation of etching holes 16 through first sacrificial material layer 14 at the subsequent outlet 80 of pressure feed, soundwave feed, or medium feed 76 at free space 57, and locally removing second sacrificial material layer 24 at the same position. In the specific embodiment of FIG. 4C, only particles having at most a size equal to the gap distance $\Delta_3$ at the subsequent outlet 80 of pressure feed, soundwave feed, or medium feed 76 can penetrate into free space 57.

Figure 4D:
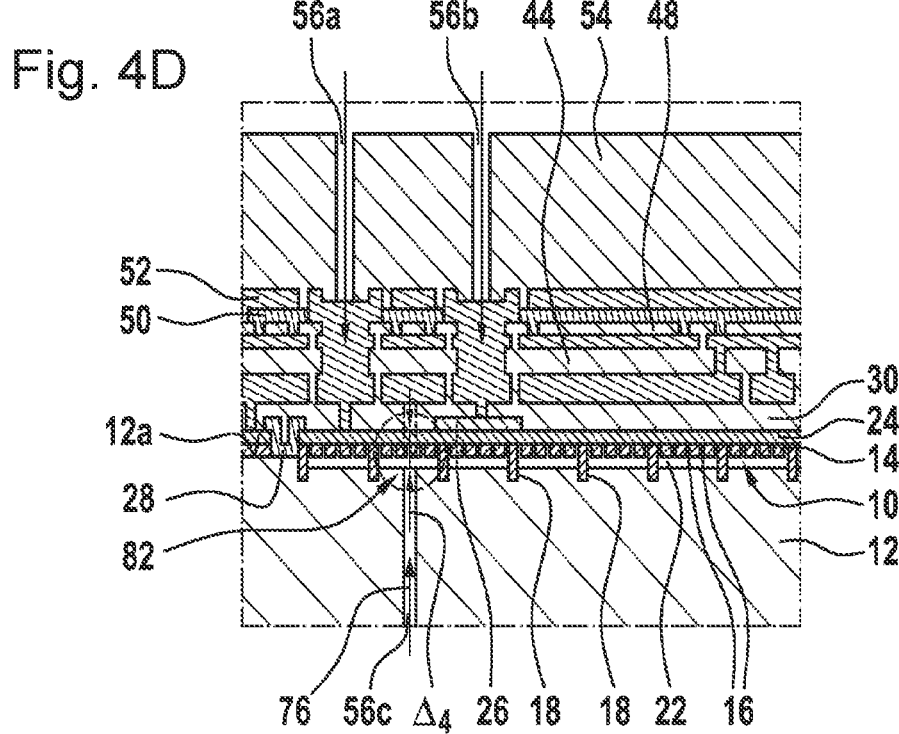

FIG. 4D is a partial section of FIG. 3. A gap distance $\Delta_4$ oriented perpendicularly to substrate surface 12a at a subsequent outlet 82 of pressure feed, soundwave feed, or medium feed 76 running through substrate 12 in free space 57 is equal to a sum of the maximum extension of the at least one cavity 22 oriented perpendicularly to substrate surface 12a, the first layer thickness of first sacrificial material layer 14, and the second layer thickness of second sacrificial material layer 24. The particles/foreign particles penetrating into free space 57 through the gap distance $\Delta_4$ at the subsequent outlet 82 of pressure feed, soundwave feed, or medium feed 76 can thus have at most a size equal to the sum of the maximum extension of the at least one cavity 22, the first layer thickness of first sacrificial material layer 14, and the second layer thickness of second sacrificial material layer 24.

Figure 4E:
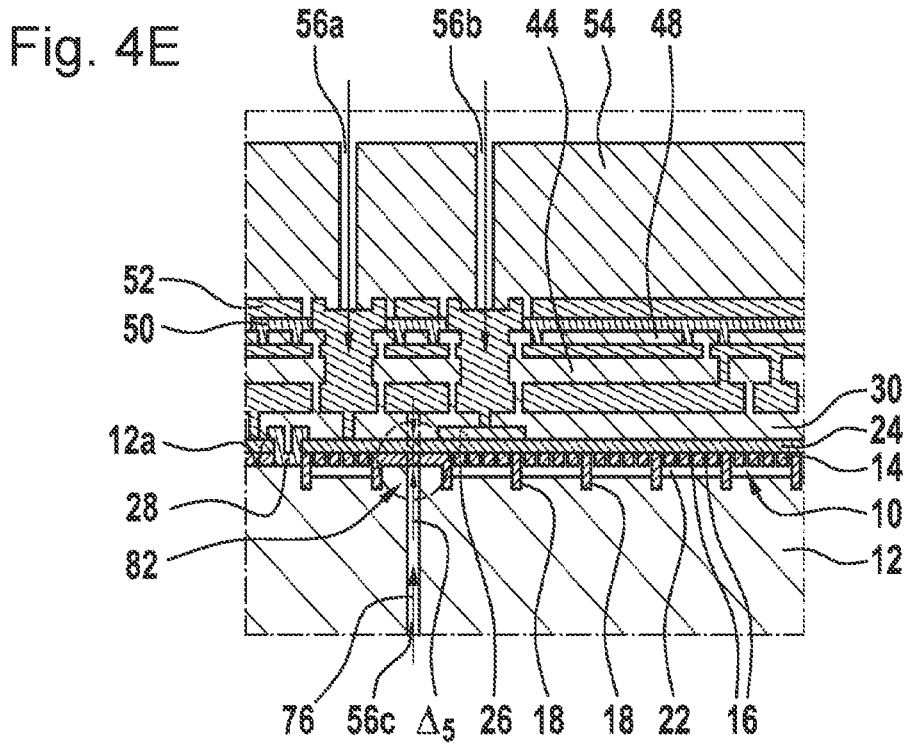

In the example of FIG. 4E, the gap distance $\Delta_5$ oriented perpendicularly to substrate surface 12a at the subsequent outlet 82 of pressure feed, soundwave feed, or medium feed 76 at free space 57, or at the outlet of channel 56c, which is utilized as a third etchant access 56c, is equal to the sum of the first layer thickness of first sacrificial material layer 14 and the second layer thickness of second sacrificial material layer 24. This is achieved by locally omitting the formation of etching holes 16 through first sacrificial material layer 14 at the subsequent outlet 82 of pressure feed, soundwave feed, or medium feed 76 at free space 57. Particles penetrating into free space 57 through the gap distance $\Delta_5$ at the subsequent outlet 82 of pressure feed, soundwave feed, or medium feed 76 can thus have at most a size equal to the sum of the first layer thickness of first sacrificial material layer 14 and the second layer thickness of second sacrificial material layer 24.

Figure 4F:
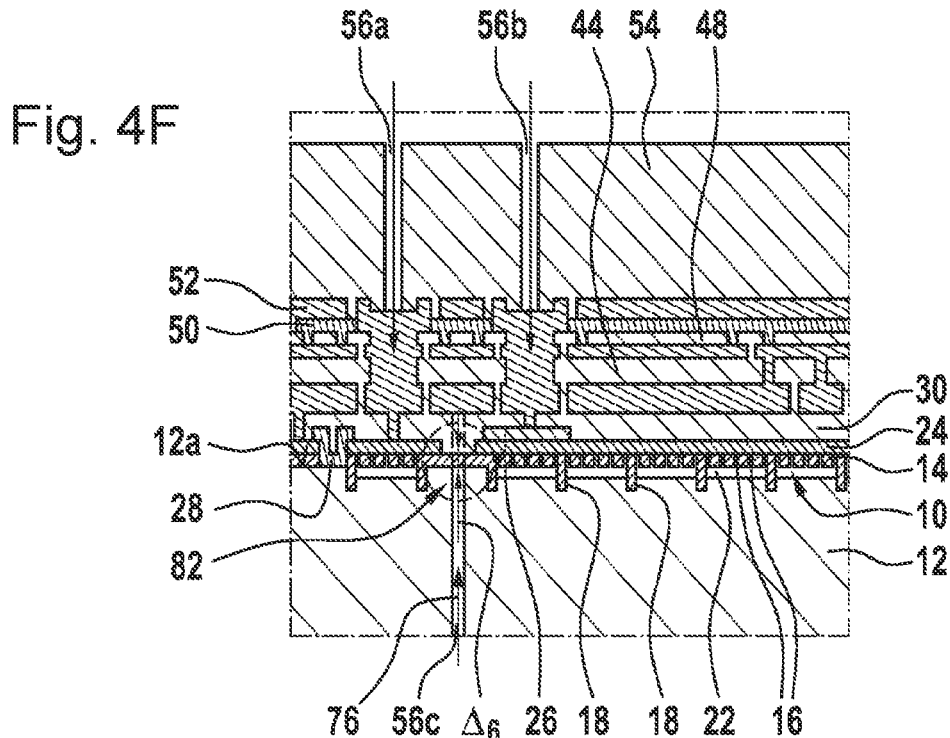

Finally, in the example of FIG. 4F, the gap distance $\Delta_6$ oriented perpendicularly to substrate surface 12a at the subsequent outlet 82 of pressure feed, soundwave feed, or medium feed 76 into free space 57 is reduced to the first layer thickness of first sacrificial material layer 14. This is achieved by locally omitting the formation of etching holes 16 through first sacrificial material layer 14 at the subsequent outlet 82 of pressure feed, soundwave feed, or medium feed 76 at free space 57, and locally removing second sacrificial material layer 24 at the same position. In the specific embodiment of FIG. 4F, only particles with at most a size equal to the gap distance $\Delta_6$ at the subsequent outlet 82 of pressure feed, soundwave feed, or medium feed 76 can penetrate into free space 57.

To prevent (in addition) particles/foreign particles from being introduced into free space 57 at outlet 80 or 82 of pressure feed, soundwave feed, or medium feed 76, the possibility also exists of forming at least one lattice structure in pressure feed, soundwave feed, or medium feed 76.

In all the production methods described above, standard processes from semiconductor technology may be used to deposit and structure the individual layers. Furthermore, all the production methods described above may be supplemented with chemical mechanical polishing steps.

All the production methods described above are advantageously suitable for producing sensor devices and microphone devices, and particularly for producing capacitive pressure sensors in which diaphragm 30 or electrode 42 suspended on diaphragm 30 is employed for pressure measurements together with counter electrode 38. Likewise, the micromechanical components produced by way of the production methods described above may be utilized as at least parts of capacitive acoustic transducers for converting soundwaves into electrical signals. Because of the advantageous protection of diaphragm 30 by way of substrate 12, as a rule even if the intermediate product in question comes into contact with other components, such as with chucks or handling systems, during the production process, no/hardly any mechanical damage to diaphragm 30 occurs.

Similarly, the micromechanical components of FIGS. 1H, 2, and 3 may be utilized as at least parts of sensor devices and microphone devices, such as capacitive pressure sensors or capacitive acoustic transducers for converting soundwaves into electrical signals. Using a capacitive pressure sensor of this type, in particular very low pressures can be measured, since diaphragm 30 may be configured to be very fragile without the risk of premature mechanical damage to the fragile diaphragm 30. The fragile configuration of diaphragm 30 may be achieved, for example, by increasing the size of its diaphragm surface, and/or by decreasing its diaphragm thickness. Furthermore, it is pointed out that possible uses of the micromechanical components of FIGS. 1H, 2, and 3 are not restricted to the applications described here.

Each of the micromechanical components of FIGS. 1H, 2, and 3 is in each case configured with: a substrate 12 having a substrate surface 12a, on which a diaphragm 30 composed of at least one semiconductor material is stretched in such a way that diaphragm 30 spans at least one free space 57 etched into substrate surface 12a, and a layer stack 34 deposited on a side of diaphragm 30 facing away from substrate 12, having at least one counter electrode 38, with a void 59 being formed in layer stack 34 between diaphragm 30 and the at least one counter electrode 38, which void is bordered by diaphragm 30. It can be recognized from these features that the micromechanical components of FIGS. 1H, 2, and 3 have been produced by way of one of the production methods described above.

The fact that the micromechanical components of FIGS. 1H, 2, and 3 have been produced by way of one of the production methods described above can also be recognized from the fact that a maximum gap width $\sigma$ of free space 57 oriented perpendicularly to substrate surface 12a is greater than or equal to 5 µm (micrometers). Moreover, the fact that the micromechanical components of FIGS. 1H, 2, and 3 have been produced by way of one of the production methods described above can also be recognized from the fact that, on a side of free space 57 facing away from diaphragm 30 and bordering substrate 12, a plurality of trenches 20a etched into substrate 12 remain as residual structures 20a of the "former" trenches. Trenches 20a/residual structures 20a are "traces"/impressions of anchoring regions 18a of the former supporting posts 18 still projecting into substrate 12 after the supporting posts 18 have been etched in the at least one cavity 22. Trenches 20a preferably have a height oriented perpendicularly to substrate surface 12a of between 0.5 µm and 2 µm (micrometers); these numerical values are not intended to be construed as being limiting.

What is claimed is:

1. A production method for a micromechanical component for a sensor device or microphone device, the method comprising the following steps:

forming a supporting structure including a first sacrificial material on a substrate surface of a substrate, the supporting structure being formed using a first sacrificial material layer including the first sacrificial material at least partially covering the substrate surface, the sacrificial material layer including a plurality of etching holes structured through the first sacrificial material layer, and using a plurality of supporting posts including the first sacrificial material projecting into the substrate;

etching into the substrate surface at least one cavity spanned by the supporting structure using an etchant passed through the plurality of etching holes in the first sacrificial material layer, the first sacrificial material having a higher etch resistance to the etchant than the substrate;

forming a diaphragm including at least one semiconductor material on or over the first sacrificial material layer of the supporting structure;

depositing a layer stack on a side of the diaphragm facing away from the substrate, the layer stack including at least one sacrificial layer and at least one counter electrode formed on a side of the at least one sacrificial layer facing away from the diaphragm; and exposing the diaphragm by at least partially removing at least the supporting structure and the at least one sacrificial layer.

2. The production method as recited in claim 1, wherein to form the supporting structure including the first sacrificial material on the substrate surface of the substrate the following steps are performed:

structuring a plurality of trenches into the substrate surface of the substrate;

depositing the first sacrificial material on the substrate surface with the plurality of trenches structured therein such that the plurality of supporting posts projecting into the substrate are formed from the first sacrificial material filled into the plurality of trenches and the substrate surface is at least partially covered with the subsequent first sacrificial material layer including the first sacrificial material;

structuring the plurality of etching holes through the first sacrificial material layer; and etching the cavity into the substrate surface through the plurality of etching holes in the first sacrificial material layer.

3. The production method as recited in claim 1, wherein, before the diaphragm is formed, the first sacrificial material layer is at least partially covered with a second sacrificial material layer including the first sacrificial material and/or a second sacrificial material, and wherein, when the diaphragm is being formed, the second sacrificial material layer is at least partially covered by the diaphragm.

4. The production method as recited in claim 1, wherein the supporting structure is formed from silicon dioxide as the first sacrificial material.

5. The production method as recited in claim 4, wherein, before the diaphragm is formed, silicon-rich silicon nitride and/or silicon nitride and/or silicon carbide, and/or aluminum oxide is deposited locally on the first sacrificial material layer including silicon dioxide, and/or on the second sacrificial material layer including silicon dioxide, and/or in at least one aperture structured through the first sacrificial material layer including silicon dioxide.

6. The production method as recited in claim 1, wherein, to expose the diaphragm, at least one first etchant access extending through the layer stack, at least one second etchant access extending only through a part of the layer stack, and/or a channel extending through the substrate, is formed, and at least the supporting structure and the at least one sacrificial layer are at least partially removed using at least one etchant passed through the at least one first etchant access, and/or through the at least one second etchant access, and/or through the at least one channel.

7. The production method as recited in claim 1, wherein, to feed pressure to the diaphragm, at least one channel is formed, extending through the substrate into free space between the diaphragm and the substrate.

\* \* \* \* \*